(12) United States Patent
Liu et al.

(10) Patent No.: US 7,687,378 B2
(45) Date of Patent: Mar. 30, 2010

(54) FABRICATING METHOD OF NITRIDE SEMICONDUCTOR SUBSTRATE AND COMPOSITE MATERIAL SUBSTRATE

(75) Inventors: Po-Chun Liu, Taichung County (TW); Wen-Yueh Liu, Taipei (TW); Chih-Ming Lai, Pingtung County (TW); Yih-Der Guo, Hsinchu (TW); Jenq-Dar Tsay, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 645 days.

(21) Appl. No.: 11/467,167

(22) Filed: Aug. 25, 2006

(65) Prior Publication Data

US 2008/0006849 A1  Jan. 10, 2008

(30) Foreign Application Priority Data

Jun. 7, 2006  (TW) ............................. 95120186 A

(51) Int. Cl.
*H01L 21/20* (2006.01)

(52) U.S. Cl. .................. 438/481; 438/458; 438/497; 438/503

(58) Field of Classification Search .................. 257/76, 257/200–201, E29.089; 438/455, 459, 481, 438/493–494, 497–498, 503–504, 458
See application file for complete search history.

(56) References Cited

U.S. PATENT DOCUMENTS

| | | | |
|---|---|---|---|
| 5,654,226 A | 8/1997 | Temple et al. | |
| 6,468,347 B1 * | 10/2002 | Motoki et al. | 117/89 |
| 6,964,914 B2 | 11/2005 | Ghyselen et al. | |
| 7,294,200 B2 * | 11/2007 | Fujikura et al. | 117/86 |
| 7,338,828 B2 * | 3/2008 | Imer et al. | 438/46 |
| 7,361,576 B2 * | 4/2008 | Imer et al. | 438/479 |
| 7,407,865 B2 * | 8/2008 | Park | 438/442 |
| 2002/0031851 A1 | 3/2002 | Linthicum et al. | |
| 2003/0114017 A1 | 6/2003 | Wong et al. | |
| 2004/0023468 A1 * | 2/2004 | Ghyselen et al. | 438/455 |
| 2005/0032329 A1 | 2/2005 | Chen et al. | |
| 2007/0184637 A1 * | 8/2007 | Haskell et al. | 438/481 |
| 2007/0252164 A1 * | 11/2007 | Zhong et al. | 257/98 |
| 2008/0163814 A1 * | 7/2008 | Kim et al. | 117/95 |

* cited by examiner

*Primary Examiner*—M. Wilczewski
*Assistant Examiner*—Toniae M Thomas
(74) *Attorney, Agent, or Firm*—Jianq Chyun IP Office

(57) ABSTRACT

A fabricating method of nitride semiconductor substrate is provided. First, a first substrate including a first base material, a nitride semiconductor template layer stacked on the first base material, and a first dielectric layer stacked on the nitride semiconductor template layer is provided. Then, the first dielectric layer and the nitride semiconductor template layer are patterned, and a second substrate including a second base material and a second dielectric layer stacked on the second base material is provided. Next, the nitride semiconductor template layer and the first dielectric layer of the first substrate are transferred onto the second dielectric layer of the second substrate through bonding and transferring processes, and then a nitride semiconductor thick film is grown from the nitride semiconductor template layer through an epitaxy process. After that, the nitride semiconductor thick film and the second substrate are separated.

14 Claims, 5 Drawing Sheets

FABRICATING METHOD OF NITRIDE SEMICONDUCTOR SUBSTRATE AND COMPOSITE MATERIAL SUBSTRATE

CROSS-REFERENCE TO RELATED APPLICATION

This application claims the priority benefit of Taiwan application serial no. 95120186, filed Jun. 7, 2006. All disclosure of the Taiwan application is incorporated herein by reference.

BACKGROUND OF THE INVENTION

1. Field of the Invention

The present invention relates to a fabricating method of a nitride semiconductor substrate. More particularly, the present invention relates to a method of fabricating nitride semiconductor substrate of low defect density and a composite material substrate with patterned structure which is fabricated with the method.

2. Description of Related Art

In recent years, GaN and related ternary compound semiconductors are widely applied to short wavelength optoelectronic devices and high-power high-frequency devices, however, due to the difficulties in fabricating GaN substrate, such semiconductors are generally grown on sapphire substrate and SiC substrate. Even though GaN monocrystal can be successfully grown on these two substrates through heteroepitaxy technology, high density defects are usually produced during epitaxy process due to large lattice mismatch, and such defects will limit the application and development of GaN material in optoelectronic semiconductor devices.

In General, due to the limitation in solubility and diffusibility of nitrogen in liquid gallium, it is very difficult to fabricate GaN substrate by using conventional single crystal growth technology. Thus, in recent years, hydride vapor phase epitaxy (HVPE) is developed and used for increasing the thickness of GaN on sapphire substrate greatly, so as to grow GaN thick film, however, the defect density and macrocracking can not be reduced effectively, and the main factor thereof is still caused by the differences between lattice constants and coefficients of thermal expansion (CTE) existing in hetero-materials.

Presently, some patents for fabricating low defect density GaN substrate have been issued already, such as U.S. Pat. No. 6,964,914. In this patent, first, $H^+$ implantation is performed to GaN or AlN monocrystal base material, and the implantation depth is the thickness of GaN after subsequent transferring. Then, the thin GaN layer is transferred onto other supporting substrate through direct-wafer-bonding or intermediate-wafer-bonding after the implantation process, and the transferred monocrystal layer is referred to as nucleation layer. Next, a thick GaN monocrystal layer is grown through HVPE. Finally, the GaN thick film and the supporting substrate are separated.

However, the foregoing U.S. patent has some disadvantages even though it can be used for fabricating free standing GaN thick film, for example, the bonding temperature up to 800~1000° C., and the separating temperature of nucleation layer is also up to 900~950° C., high temperatures may cause GaN or the supporting substrate to burst due to the difference in CTE. In addition to this, the present cost of GaN substrate is up to US$10,000.

SUMMARY OF THE INVENTION

Accordingly, the present invention is directed to provide a fabricating method of nitride semiconductor substrate for fabricating low defect density semiconductor substrate.

According to another aspect of the present invention, a composite material substrate having patterned structure is provided, which is suitable for growing nitride semiconductor substrate with low defect density.

The present invention provides a fabricating method of nitride semiconductor substrate. First, a first substrate including a first base material, a nitride semiconductor template layer stacked on the first base material, and a first dielectric layer stacked on the nitride semiconductor template layer is provided. Then, the first dielectric layer and the nitride semiconductor template layer are patterned, and a second substrate including a second base material and a second dielectric layer stacked on the second base material is provided. Next, the nitride semiconductor template layer and the first dielectric layer of the first substrate are transferred onto the second dielectric layer of the second substrate through bonding and transferring processes, and then a nitride semiconductor thick film is grown from the nitride semiconductor template layer through an epitaxy process. After that, the nitride semiconductor thick film and the second substrate are separated.

The present invention further provides a composite material substrate having patterned structure, which includes a substrate, a first dielectric layer, a second dielectric layer, and a nitride semiconductor material. Wherein, the first dielectric layer is stacked on the substrate, the second dielectric layer is stacked on the first dielectric layer, and the nitride semiconductor material is stacked on the second dielectric layer and is characterized by a plurality of patterns thereon.

According to the present invention, when a nitride semiconductor substrate is fabricated, the nitride semiconductor template layer is patterned first to greatly reduce the defect density at subsequent epitaxy growing, and then the foregoing nitride semiconductor template layer is transferred onto a hetero-substrate as monocrystal seed layer through wafer bonding. Furthermore, the nitride semiconductor substrate with low defect density can be obtained through mechanical self-separation or chemical etching separation in the end.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A~1I are cross-sectional views illustrating the fabricating flow of a nitride semiconductor substrate according to an exemplary embodiment of the present invention.

Figure 1A:
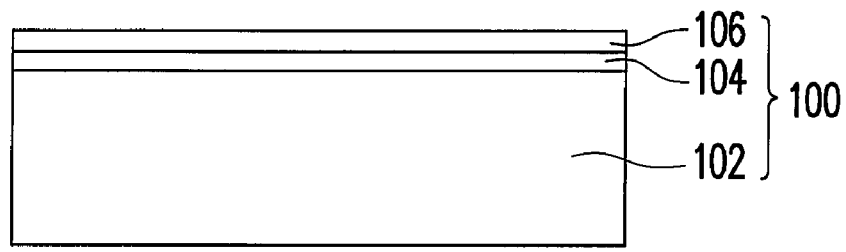
FIGS. 1A~1I are cross-sectional views illustrating the fabricating flow of a nitride semiconductor substrate according to an exemplary embodiment of the present invention.

Referring to FIG. 1A, a first substrate 100 is provided, wherein the first substrate 100 includes a first base material 102, a nitride semiconductor template layer 104 stacked on the first base material 102, and a first dielectric layer 106 stacked on the nitride semiconductor template layer 104. Wherein, the material of the nitride semiconductor template layer 104 is, for example, semiconductor material containing one of In, Al, and Ga, such as GaN, AlN, InN, AlGaN, InGaN, or AlInN. The first base material 102 is an epitaxy substrate, such as sapphire, SiC, or Si substrate. The material of the first dielectric layer 106 may be $SiO_2$, $Si_3N_4$, spin on glass (SOG), or other suitable material.

Referring to FIG. 1A again, all the layers shown herein (namely, the nitride semiconductor template layer 104 and the first dielectric layer 106) can be formed by using methods well-known to those having ordinary skill in the art. For example, the formation method of the nitride semiconductor template layer 104 may be metal-organic chemical vapor deposition (MOCVD) or molecular beam epitaxy (MBE).

Figure 1B:
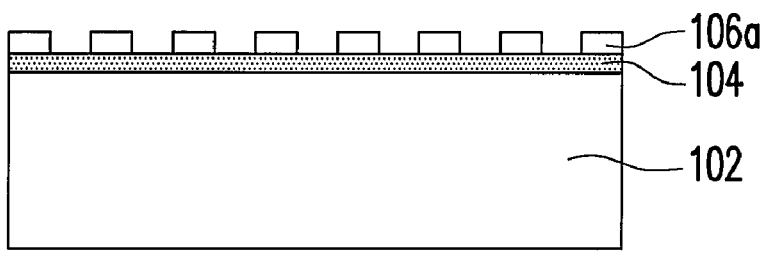

Next, referring to FIG. 1B, the first dielectric layer 106 and the nitride semiconductor template layer 104 in FIG. 1A are patterned, the method used herein includes lithography and etching technologies, and the flow thereof is as shown in FIG. 1B, wherein the first dielectric layer 106 is patterned first so that the patterned first dielectric layer 106a has linear, reticular, or dotted pattern.

Figure 1C:
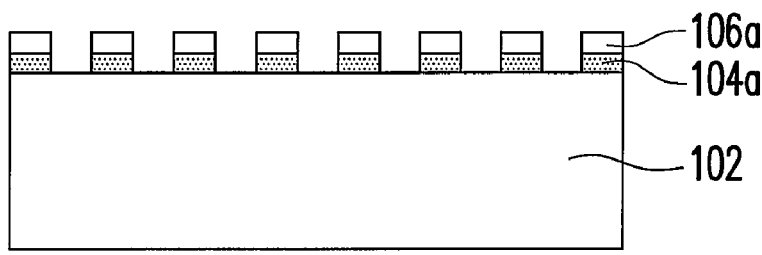

Next, referring to FIG. 1C, the nitride semiconductor template layer 104 is etched using the patterned first dielectric layer 106a as an etching mask. Here, the same pattern as that on the first dielectric layer 106a will be formed on the etched nitride semiconductor template layer 104a. Besides, the patterning process may also be performed to the nitride semiconductor template layer 104 and the first dielectric layer 106 with a photoresist layer (not shown) as the etching mask.

Figure 1D:
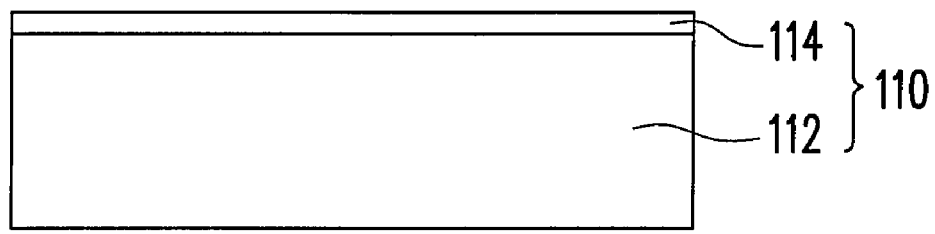

Next, referring to FIG. 1D, a second substrate 110 is provided as the supporting substrate, and the second substrate 110 includes at least a second base material 112 and a second dielectric layer 114 stacked on the second base material 112. Wherein, the second base material 112 is, for example, sapphire, Si, GaP, InP, quartz, high temperature glass, or ceramic substrate. The material of the second dielectric layer 114 is, for example, $SiO_2$, $Si_3N_4$, or SOG. Moreover, if necessary, the second dielectric layer 114 can be further patterned after the second substrate 110 is provided in order to help the immersion of the chemical etching solution in subsequent process.

Figure 1E:
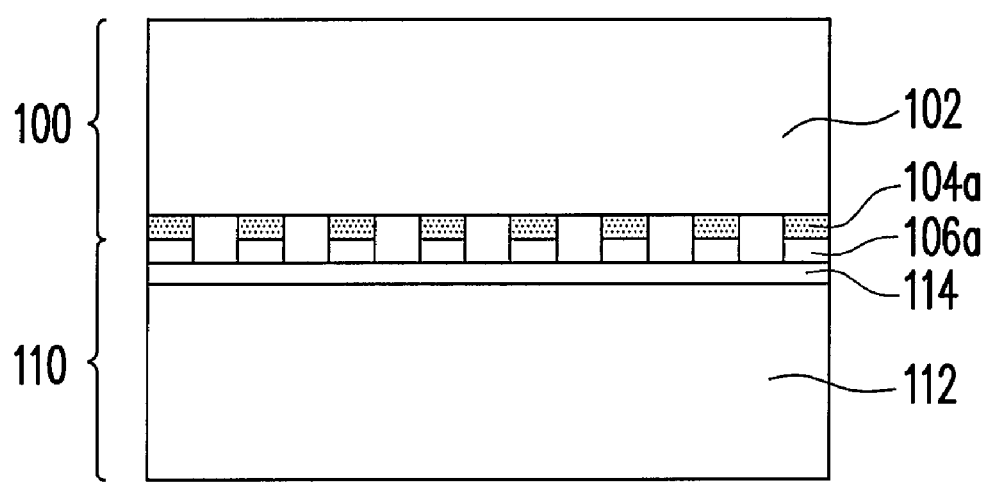

Next, referring to FIG. 1E, the nitride semiconductor template layer 104a and the first dielectric layer 106a of the first substrate 100 are transferred onto the second dielectric layer 114 of the second substrate 110 through bonding and transferring processes. Wherein, the first dielectric layer 106a and the second dielectric layer 114 can be bonded first by using hydrophilic (SC1=$H_2O$—$NH_4OH$—$H_2O_2$) wafer bonding. Next, the nitride semiconductor template layer 104a is transferred onto the second substrate 110 through mechanical force. For example, the steps of bonding and transferring can be directly completed through the difference between the coefficients of thermal expansion (CTE) of the materials when the materials of the first base material 102 and the second base material 112 are Si or sapphire.

Figure 1F:
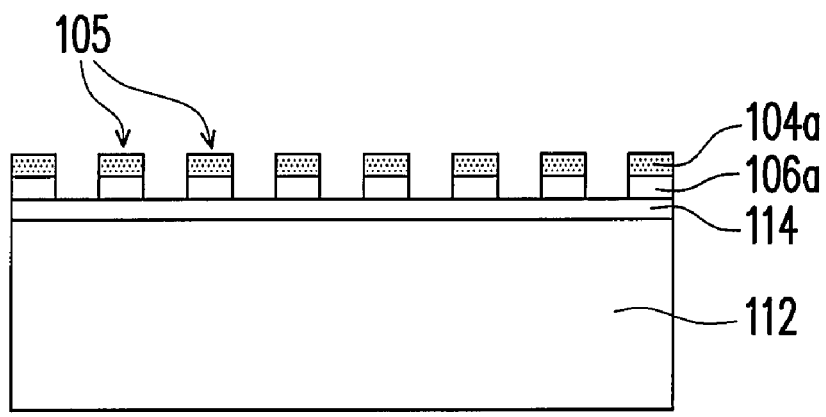

Next, referring to FIG. 1F, after the foregoing bonding and transferring processes, chemical mechanical polishing (CMP) or reactive ion etching is performed to the nitride semiconductor template layer 104a to obtain epi-ready surface 105 and to reduce defect density.

Figure 1G:
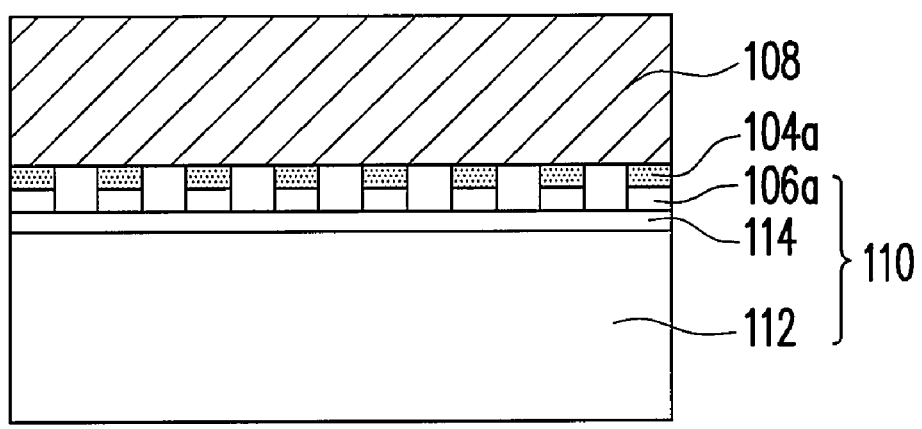

Moreover, referring to FIG. 1G, a nitride semiconductor thick film 108 is grown from the nitride semiconductor template layer 104a through an epitaxy process, wherein the material of the nitride semiconductor thick film 108 includes GaN, AlN, or other material having lattice constant similar to that of the nitride semiconductor template layer 104a. The foregoing epitaxy process is performing GaN monocrystal lateral bonding and thick film growing based on the patterned nitride semiconductor template layer 104a, and the growing method includes epitaxy process, which includes hydride vapor phase epitaxy (HVPE), metal-organic chemical vapor deposition (MOCVD), or molecular beam epitaxy (MBE).

Figures 1, 1H:
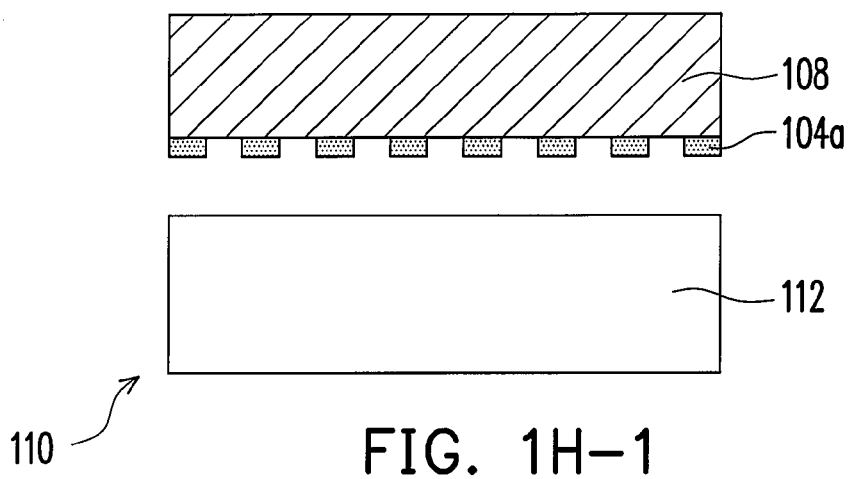
Figures 1, 1H, 2:
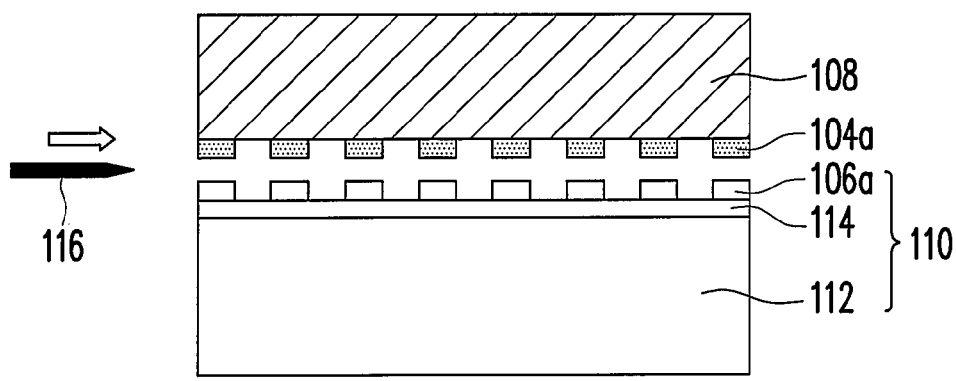
FIG. 2 is a cross-sectional view illustrating the structure of a composite material substrate having patterned structure according to another exemplary embodiment of the present invention.

Then refer to FIG. 1H-1 and FIG. 1H-2, which illustrate different methods for separating the nitride semiconductor thick film 108 and the second substrate 110.

In FIG. 1H-1, the bonded first and second dielectric layers 106a and 114 (referring to FIG. 1G) are removed through chemical etching, wherein the chemical etching solution includes hydrofluoric acid (HF) or boffered oxide etch (BOE); for example, BOE=49%, HF:40% $NH_4F$=1:6. Moreover, the immersion of the chemical etching solution is made easier if the second dielectric layer 114 is patterned after the second substrate is provided (as shown in FIG. 1D).

In FIG. 1H-2, the nitride semiconductor thick film 108 and the second substrate 110 are separated through mechanical force, for example, by using a sharp knife 116. Besides, the method for separating the nitride semiconductor thick film 108 and the second substrate 110 may also be alternately applying the chemical etching in FIG. 1H-1 and the mechanical force in FIG. 1H-2 to accelerate the separation. Polishing and chemical etching can be used directly to remove the second base material 112 when the second base material 112 is quartz or high temperature glass.

Figure 1I:
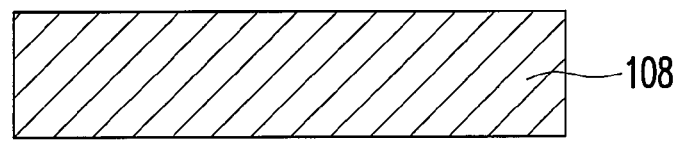
Figure 2:
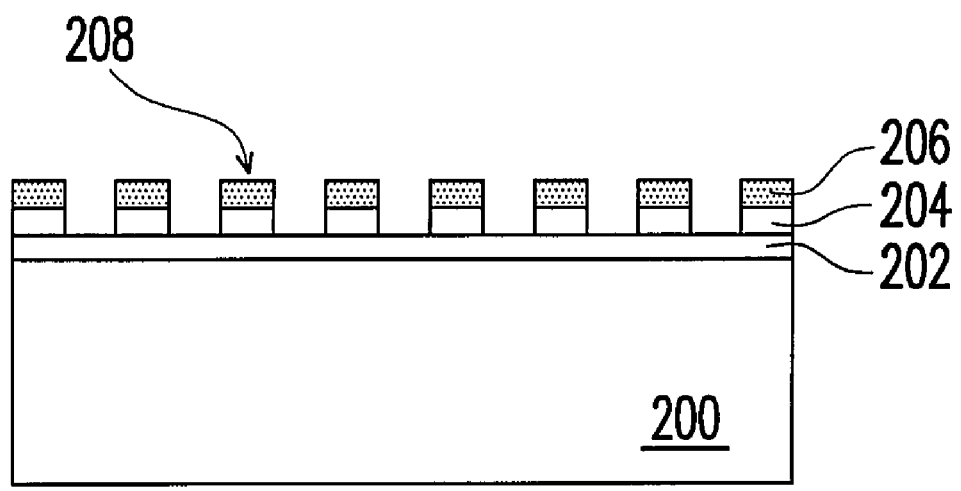

Finally, referring to FIG. 1I, surface polishing process, such as chemical mechanical polishing (CMP), can be performed to the nitride semiconductor thick film 108 obtained through separation.

FIG. 2 is a cross-sectional view illustrating the structure of a composite material substrate having patterned structure according to another exemplary embodiment of the present invention, wherein the composite material substrate is suitable for fabricating free standing nitride semiconductor substrate.

Referring to FIG. 2, the composite material substrate in the present embodiment includes a substrate 200, a first dielectric layer 202, a second dielectric layer 204, and a nitride semiconductor material 206, wherein the substrate 200 can be Si, GaP, InP, quartz, glass, or ceramic substrate, for example. The first dielectric layer 202 is stacked on the substrate 200, the second dielectric layer 204 is stacked on the first dielectric layer 202, and the materials of the first dielectric layer 202 and the second dielectric layer 204 respectively include $SiO_2$, $Si_3N_4$, spin on glass (SOG) or other suitable materials. The nitride semiconductor material 206 is stacked on the second dielectric layer 204, wherein the material of the nitride semiconductor material 206 includes semiconductor materials containing one of In, Al, and Ga, such as GaN, AlN, InN, AlGaN, InGaN, or AlInN. Moreover, the nitride semiconductor material 206 has a plurality of patterns 208 on its surface, and the pattern 208 is, for example, linear, reticular, dotted, or other suitable pattern.

In overview, the advantage of the present invention is that a patterned nitride semiconductor template layer is used as monocrystal seed layer, so that defect density at subsequent epitaxy growing can be reduced greatly. Moreover, the foregoing nitride semiconductor template layer is transferred onto a hetero-substrate through wafer bonding. Furthermore, nitride semiconductor substrate of low defect density can be obtained through mechanical force self-separation or chemical etching separation after the epitaxy process, thus, the technology provided by the present invention is simpler and has lower cost compared to existing technologies.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method of nitride semiconductor substrate, comprising:
   providing a first substrate, the first substrate comprising a first base material, a nitride semiconductor template layer stacked on the first base material, and a first dielectric layer stacked on the nitride semiconductor template layer;
   patterning the first dielectric layer and the nitride semiconductor template layer;
   providing a second substrate, the second substrate comprising a second base material and a second dielectric layer stacked on the second base material;
   transferring the nitride semiconductor template layer and the first dielectric layer of the first substrate onto the second dielectric layer of the second substrate through bonding and transferring processes;
   growing a nitride semiconductor thick film from the nitride semiconductor template layer through an epitaxy process; and
   separating the nitride semiconductor thick film and the second substrate.

2. The fabricating method as claimed in claim 1, wherein the method for patterning the first dielectric layer and the nitride semiconductor template layer comprises lithography and etching technologies.

3. The fabricating method as claimed in claim 2, wherein the steps of patterning the first dielectric layer and the nitride semiconductor template layer comprise:
   pattering the first dielectric layer; and
   etching the nitride semiconductor template layer by using the patterned first dielectric layer as an etching mask.

4. The fabricating method as claimed in claim 1, wherein the method for patterning the first dielectric layer and the nitride semiconductor template layer comprises making the first dielectric layer and the nitride semiconductor template layer being linear, reticular, or dotted patterns.

5. The fabricating method as claimed in claim 1, wherein the materials of the first dielectric layer and the second dielectric layer respectively comprise $SiO_2$, $Si_3N_4$ or spin on glass.

6. The fabricating method as claimed in claim 1, wherein the second base material comprises sapphire, Si, GaP, InP, quartz, high temperature glass, or ceramic substrate.

7. The fabricating method as claimed in claim 1, wherein the epitaxy process comprises hydride vapor phase epitaxy (HVPE), metal-organic chemical vapor deposition (MOCVD), or molecular beam epitaxy (MBE).

8. The fabricating method as claimed in claim 1, wherein the method for separating the nitride semiconductor thick film and the second substrate comprises separating with chemical etching or mechanical force.

9. The fabricating method as claimed in claim 8, wherein the method for separating the nitride semiconductor thick film and the second substrate comprises applying chemical etching and mechanical force alternately to accelerate the separation.

10. The fabricating method as claimed in claim 8, wherein the chemical etching solution comprises hydrofluoric acid (HF) or buffered oxide etchant (BOE).

11. The fabricating method as claimed in claim 1, wherein the second dielectric layer is further patterned after the second substrate is provided.

12. The fabricating method as claimed in claim 1, wherein chemical mechanical polishing or reactive ion etching is further performed to the nitride semiconductor template layer to obtain epi-ready surface after the nitride semiconductor template layer and the first dielectric layer of the fast substrate are transferred onto the second dielectric layer of the second substrate.

13. The fabricating method as claimed in claim 1, wherein surface polishing process is further performed to the nitride semiconductor thick film after the nitride semiconductor thick film and the second substrate are separated.

14. The fabricating method as claimed in claim 1, wherein the material of the nitride semiconductor thick film comprises GaN or AlN.

\* \* \* \* \*